(12) United States Patent
Chau et al.

(10) Patent No.: US 6,825,506 B2
(45) Date of Patent: Nov. 30, 2004

(54) FIELD EFFECT TRANSISTOR AND METHOD OF FABRICATION

(75) Inventors: Robert S. Chau, Beaverton, OR (US); Douglas Barlage, Durham, NC (US); Been-Yih Jin, Lake Oswego, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/306,640

(22) Filed: Nov. 27, 2002

(65) Prior Publication Data

US 2004/0099966 A1 May 27, 2004

(51) Int. Cl.[7] .................................. H01L 31/072
(52) U.S. Cl. ................. 257/192; 257/190; 257/344; 257/616
(58) Field of Search .................. 257/190, 192, 257/344, 616, 194, 347, 913

(56) References Cited

U.S. PATENT DOCUMENTS

| | | | |
|---|---|---|---|
| 5,111,255 A | * 5/1992 | Kiely et al. | 372/45 |
| 5,164,797 A | * 11/1992 | Thornton | 372/45 |
| 5,245,208 A | * 9/1993 | Eimori | 257/344 |
| 5,378,923 A | * 1/1995 | Mitsui et al. | 257/616 |
| 5,430,310 A | * 7/1995 | Shibasaki et al. | 257/190 |
| 5,581,092 A | 12/1996 | Takemura | |
| 5,683,934 A | 11/1997 | Candelaria | |
| 5,698,869 A | * 12/1997 | Yoshimi et al. | 257/192 |
| 5,798,540 A | * 8/1998 | Boos et al. | 257/194 |
| 5,986,291 A | * 11/1999 | Currie et al. | 257/194 |
| 6,207,977 B1 | 3/2001 | Augusto | |

FOREIGN PATENT DOCUMENTS

| | | |
|---|---|---|
| EP | 0 531 550 A1 | 3/1993 |
| EP | 1 020 898 A | 7/2000 |
| EP | 1 119 029 A | 7/2001 |
| JP | 60-251666 | 5/1986 |
| WO | WO 01/88995 A | 11/2001 |

OTHER PUBLICATIONS

International Search Report PCT/US 03/34667.
Ikeda, K. et al. "50–NM Gate Schottky Source/Drain P–MOSFETS with a SIGE Channel" IEEE Electron Device Letters, IEEE Inc., New York, US, vol. 23, No. 11, Nov. 2002, pp. 670–672, XP001158217, ISSN: 0741–3106, Figure 1.
Chang, C–Y et al. "High Performance Thin–Film Transistors with Low–High–Low Band Gap Engineering", Proceeding of the SPIE, Bellingham, VA, US, vol. 3421, Jul. 1998, pp. 152–158, XP001189049, ISSN: 0277–786X.

* cited by examiner

Primary Examiner—David Nelms
Assistant Examiner—Dao H. Nguyen
(74) Attorney, Agent, or Firm—Blakely, Sokoloff, Taylor & Zafman LLP

(57) ABSTRACT

The present invention is a novel field effect transistor having a channel region formed from a narrow bandgap semiconductor film formed on an insulating substrate. A gate dielectric layer is formed on the narrow bandgap semiconductor film. A gate electrode is then formed on the gate dielectric. A pair of source/drain regions formed from a wide bandgap semiconductor film or a metal is formed on opposite sides of the gate electrode and adjacent to the low bandgap semiconductor film.

27 Claims, 3 Drawing Sheets

FIELD EFFECT TRANSISTOR AND METHOD OF FABRICATION

BACKGROUND OF THE INVENTION

1. Field of the Invention

The present invention relates to the field of semiconductor integrated circuits and more specifically to a depleted substrate transistor (DST) and its method of fabrication.

2. Discussion of Related Art

Modern integrated circuits today are made up of literally hundreds of millions of transistors integrated together into functional circuits. In order to further increase the computational power of logic integrated circuits, the density and performance of the transistors must be further increased and the operating voltage (Vcc) further reduced. In order to increase device performance and reduce operating voltages, silicon on insulator (SOI) transistors have been proposed for the fabrication of modern integrated circuits. Fully depleted SOI transistors have been proposed as transistor structure to take advantage of the ideal subthreshold gradients for optimized on current/off current ratios. That is, an advantage of SOI transistors is that they experience lower leakage currents thereby enabling lower operating voltage for the transistor. Lowering the operating voltage of the transistor enables low power, high performance integrated circuits to be fabricated. FIG. 1 illustrates a standard fully depleted silicon on insulator (SOI) transistor 100. SOI transistor 100 includes a single crystalline silicon substrate 102 having an insulating layer 104, such as buried oxide formed thereon. A single crystalline silicon body 106 is formed on the insulating layer 104. A gate dielectric layer 108 is formed on a single crystalline silicon body 106 and a gate electrode 110 formed on gate dielectric 108. Source 112 and drain 114 regions are formed in the silicon body 106 along laterally opposite sides of the gate electrode 110. Unfortunately, the amount of gate oxide scaling and gate length scaling that can be reliably and uniformly achieved with today's structures and processes is becoming limited.

Thus, what is desired is a novel transistor structure which enables further Vcc scaling and improved electrical performance.

DETAILED DESCRIPTION OF THE PRESENT INVENTION

The present invention is a novel field effect transistor and its method of fabrication. In the following description numerous specific details have been set forth in order to provide a thorough understanding of the present invention. However, one of ordinary skill in the art, will realize that the invention may be practiced without these particular details. In other instances, well-known semiconductor equipment and processes have not been described in particular detail so as to avoid unnecessarily obscuring the present invention.

The present invention is a novel field effect transistor and its method of fabrication. The transistor of the present invention has an ultra high channel mobility formed from a narrow bandgap semiconductor, such as InSb. Because a channel is formed from a narrow bandgap material (less than 0.7 eV at room temperature) it has a high channel mobility and saturation velocity which results in more drive current for lower voltages. Large drive current with low voltages enables a transistor to be operated at low operating voltages, such as less than 0.5 volt. The transistor can be formed on an insulating substrate so that a depleted substrate transistor (DST) can be formed. The use of an insulating substrate prevents leakage of junction charge into the substrate. The source and drain regions of the transistor can be specially engineered to help prevent or reduce leakage currents associated with narrow bandgap materials. In one embodiment of the present invention, the source/drain regions are formed from a metal, such as platinum, aluminum, and gold which can form a "Schottky" barrier with the narrow bandgap semiconductor film used to form the channel region so that a barrier to change injection is formed. In another embodiment of the present invention, the source and drain regions can be formed from a wide bandgap semiconductor film, such as InAlSb, GaP and GaSb. The use of a large bandgap semiconductor in the source/drain region (and special bandedge engineering between the source/drain semiconductor and channel region semiconductor), next to narrow bandgap channel region reduces the leakage current of the device. The use of special band engineered source/drain regions and an insulating substrate helps minimize the large junction leakage current associated with narrow bandgap materials.

Figure 1:
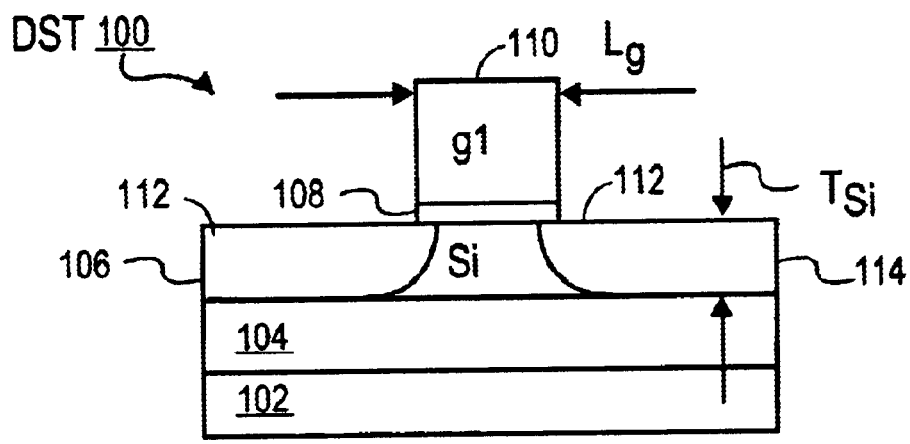
FIG. 1 is an illustration of a cross-sectional view of a silicon on insulator (SOI) transistor.
Figure 2:
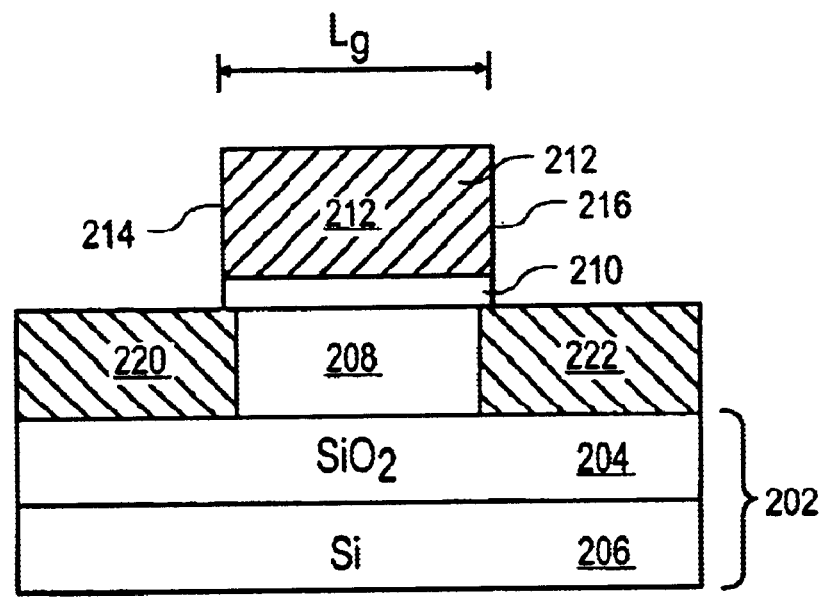
FIG. 2 is an illustration of a cross-sectional view of a field effect transistor in accordance with the present invention.

A field effect transistor 200 in accordance with an embodiment of the present invention is illustrated in FIG. 2. Field effect transistor 200 is formed on an insulating substrate 202. In an embodiment of the present invention, insulating substrate 202 includes an insulating film 204 grown on a substrate 206. In other embodiments, other types of insulating substrates, such as but not limited to hafium oxide, zirconium oxide, and barium titanate ($BaTiO_3$) may be used.

Transistor 200 includes a channel region 208 formed from a narrow bandgap, less than 0.5 eV, semiconductor film formed on insulating substrate 202. In an embodiment of the present invention, the channel region is formed from an InSb (Bandgap=0.17 eV) compound. In other embodiments, the channel region is formed with a PdTe (Bandgap=0.31 eV) or InAs (Bandgap=0.36 eV) compound film. In an embodiment of the present invention, the InSb compound is doped with n type impurities, such as arsenic, antinomy and phosphorous to a level between $1 \times 10^{17} - 1 \times 10^{18}$ atoms/cm$^2$ to fabricate a p type device. In another embodiment of the present invention, the channel region 208 is doped with p type impurities, such as boron to a level between $1 \times 10^{17} - 1 \times 10^{18}$ atoms/cm$^2$ to fabricate a n type device. In another embodiment of the present invention, the channel region 208 is an undoped or intrinsic semiconductor film having a narrow bandgap. In an embodiment of the present invention, the channel region is formed to a thickness of approximately ⅓ the gate length ($L_g$) of the device. Utilizing a thin film, less than 10 nanometers, enables a fully depleted substrate transistor (DST) to be formed with Lg of 30 nm. The use of a narrow bandgap channel region enables ultra high mobility and saturation velocities and hence high performance and low Vcc for logic applications.

Transistor 200 has a gate dielectric 210 formed on the thin film channel region 208. Although the gate dielectric 210 can be a grown dielectric, such as $SiO_2$ or silicon oxynitride, the gate dielectric is preferably a deposited dielectric so that is can be formed at lower temperatures, less than 500° C., and thereby be compatible with the narrow bandgap channel region film (e.g., InSb). In an embodiment of the present invention, the gate dielectric 210 is or includes a high dielectric constant film. A high dielectric constant film has a dielectric constant of greater than 9.0 and ideally greater than 50. A high dielectric constant film can be a metal oxide dielectric, such as but not limited to tantalum pentaoxide ($Ta_2O_5$), titanium oxide, hefium oxide, zirconium oxide, and aluminum oxide. The gate dielectric layer 210, however, can be other well known high dielectric constant films, such as lead zirconate titanate (PZT) or barium strontium titatanate (BST). Utilizing a high dielectric constant film enables a gate dielectric to be formed relatively thick between 20–3000 Å and ideally about 200 Å for a high dielectric constant (k>100) material. A thick gate dielectric layer helps block gate leakage current of the device. Any well known techniques, such as vapor deposition or sputtering can be used to deposit gate dielectric film 210. In an embodiment of the present invention, a low temperature process, between 200–500° C., is used to deposit the gate dielectric.

Transistor 200 includes a gate electrode 212 formed on a gate dielectric 210. In an embodiment of the present invention, gate electrode 212 is a metal gate electrode, such as but not limited to tungsten (W), tantalum (Ta), titanium (Ti) and their silicides and nitrides. In an embodiment of the present invention, the gate electrode is formed from a film having a work function between n type silicon and p type silicon, such as a work function between 4.1 eV and 5.2 eV. In an embodiment of the present invention, the gate electrode is formed of a metal or film having a midgap work function. A metal gate electrode is desirable when a metal oxide dielectric is used because they are compatible with metal oxide dielectrics and can be directly formed thereon. Gate electrode 212 has a pair of laterally opposite sidewalls 214 and 216 which run along the gate width of the device. The distance between the laterally opposite sidewalls defines the gate length ($L_g$) of the device. In an embodiment of the present invention, the gate electrode 212 is formed with a gate length of 300 nanometers or less. The gate width ($G_w$) of the transistor is the distance the gate electrode extends over the channel region in a direction perpendicular to the gate length (i.e., into and out of the page of FIG. 2). Gate electrode 212 need not necessarily be made of a single film, but may be made from multiple films to form a composite gate electrode which may include, for example a metal film, silicon films, and suicides. When a metal oxide dielectric is used a metal film should be formed directly on the metal oxide dielectric. In an embodiment of the present invention, gate electrode 212 is formed to a thickness between 500–1000 Å. In an embodiment of the present invention, gate electrode 212 is formed utilizing a low temperature less than 500° C. and preferably less than 350° C., process such as sputtering.

Transistor 200 includes a source region 220 and drain region 222. The source region 220 and drain region 222 are formed on insulating substrate 202 as shown in FIG. 2. The source region 220 and drain region 222 extend into and out of the page of FIG. 2 along the laterally opposite sidewalls 214 and 216 of gate electrode 212. Gate electrode 212 on gate dielectric 210 slightly overlaps the source region 220 and the drain region 222 as shown in FIG. 2. Ideally, the overlap is less than approximately 10% of the gate length on each side. The source region 220 is separated from the drain region 222 by a channel region 208 as shown in FIG. 2.

In an embodiment of the present invention, the source region 220 and the drain region 222 are formed of materials which surpress parasitic transistor leakage due to the low bandgap of the channel region. In an embodiment of the present invention, the source region 220 and drain regions 222 are formed from a wide or high bandgap semiconductor material. When forming the source 220 and drain 222 region from a semiconductor material, the band gap of the semiconductor film of the source 220 and drain 222 regions should have a bandgap which is greater than the bandgap of the channel region. In an embodiment, the bandgap of the source and drain semiconductor material is at least 0.2 eV and ideally at least 0.5 eV greater than the bandgap of the semiconductor film 208 in the channel region. The bandgap offset between the source/drain semiconductor 220 and 222 film and the channel semiconductor film 208 prevents carrier injection over the barrier. In an embodiment of the present invention, the source region 220 and drain region 222 are formed from a III-V compound semiconductor having a larger band gap compared to the channel region semiconductor, such as but not limited to InP (Bandgap= 1.35 eV), GaSb (Bandgap=0.75 eV), GaP, and GaAs (Bandgap=1.43). However, other semiconductor materials, such as germanium (Bandgap=0.67 eV) having a suitably large bandgap can be used. The source/drain semiconductor film can be a polycrystalline film or a single crystalline film. The semiconductor film 220 and 222 can be doped to a concentration level between $1 \times 10^{20}$–$1 \times 10^{21}$ atoms/cm$^3$ with n type impurities, such as arsenic, antimony or phosphorous in order to form a n type MOS device (NMOS) and can be doped to a concentration level between $1 \times 10^{20}$–$1 \times 10^{21}$ atoms/cm$^2$ with p type impurities, such as boron or gallium when forming a p type device (PMOS). By forming the source 220 and drain 222 regions with a wide or large bandgap material and placing them next to the narrow or small bandgap channel region 208 a barrier is created which suppresses parasitic transistor leakage which would normally occur with a low bandgap channel region.

In another embodiment of the present invention, the source region and drain regions are formed from a metal film. In an embodiment of the present invention, the source and drain regions are formed from a metal or film ("Schottky metal"), such as but not limited to platinum (Pf), aluminum (Al) and gold (Au) which can form a "Schottky" barrier with the semiconductor film of the channel region 208. The "Schottky" barrier which is created by placing the metal source and drain regions in contact with the semiconductor film of the channel region forms a barrier to electric flow from the source and drain regions into the channel region. In this way, a bias is needed in order to inject carriers from the source 220 and drain 222 into the channel 208. In an embodiment of the present invention, the source region and drain regions are formed from a metal film, such as but not limited to titanium nitride (TiN), tantalum nitride (TaN) and hefium nitride (HfN).

The use of an insulating substrate and special band engineered source/drain regions surpresses parasitic transistor leakage due to the low bandgap of the channel region material (e.g., InSb). In this way, transistor 200 can function as a low power, high performance device.

Transistor 200 can be operated in a fully depleted manner wherein when transistor 200 is turned "ON" the channel region 208 fully depletes thereby providing the advantageous electrical characteristics and performance of a fully depleted substrate transistor (DST). That is, when transistor 200 is turned "ON" an inversion layer at the surface of region 208 is formed that has the same conductivity type as the source and drain regions and forms a conductive channel between the source and drain regions to allow current to flow there between. A depletion region which is depleted of free carriers is formed beneath the inversion layer. The depletion region extends to the bottom of channel region 208, thus, the transistor can be said to be a "fully depleted" transistor. Fully depleted transistors have improved electrical performance characteristics over non-fully depleted or partially depleted transistors. For example, operating transistor 200 in a fully depleted manner, gives transistor 200 an ideal or very sharp subthreshold slope. Additionally, by, operating transistor 200 in a fully depleted manner, transistor 200 has improved drain induced barrier (dibble) lowering which provides for better "OFF" state leakage which results in lower leakage and thereby lower power consumption. In order to operate transistor 200 in a fully depleted manner, the thickness of channel region 208 is ideally ⅓ of the gate length ($L_g$) of the transistor.

Figure 3A:
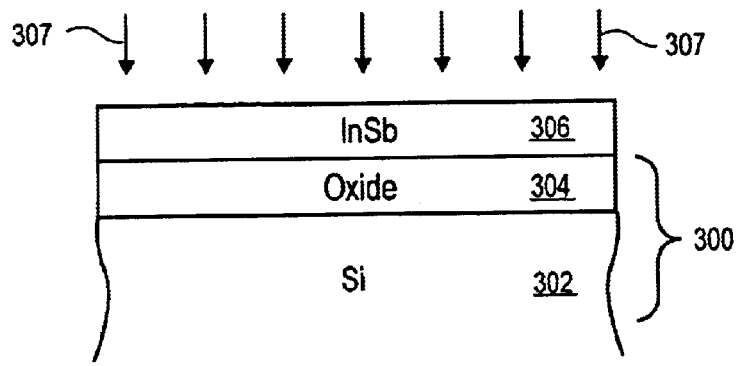
FIGS. 3A-3G illustrates a method of forming a field effect transistor in accordance with embodiments of the present invention.

FIGS. 3A–3G illustrate a method of forming the field effect transistor 200 in accordance with an embodiment of the present invention. Fabrication of field effect transistor in accordance with the present invention begins with an insulating substrate 300 having a narrow bandgap semiconductor film, such as InSb formed thereon. In an embodiment of the present invention, the substrate is an insulating substrate 300 such as shown in FIG. 3A. In an embodiment of the present invention, insulating substrate 300 includes a lower monocrystalline silicon substrate 302 and a top insulating layer 304, such as a silicon dioxide film, metal oxide or silicon nitride film. Insulating layer 304 isolates narrow bandgap semiconductor material 306 from substrate 302 and in an embodiment is formed to a thickness between 200–2000 Å. Isolating or insulating layer 304 is sometimes referred to as a "buried oxide" layer. Substrate 302 can be a semiconductor substrate, such as but not limited to a silicon monocrystalline substrate and other semiconductor substrate.

Narrow bandgap semiconductor film 306 can be formed on insulating substrate 300 with any suitable method. For example, narrow bandgap semiconductor film 306 can be formed onto an insulating substrate 300 utilizing a transfer process. In this technique, first a silicon wafer has a thin oxide grown on its surface that will later serve as the barrier oxide 304. Next, a high dose hydrogen implant is made into a narrow bandgap semiconductor film substrate to form a high stress region below the surface of the narrow bandgap semiconductor substrate. The narrow bandgap semiconductor wafer is then flipped over and bonded to the surface of the oxide 304 layer formed on the silicon substrate 302. The narrow bandgap semiconductor substrate is then cleaved along the high stress region created by the hydrogen implant. This results in a structure with a thin low bandgap semiconductor film 306 formed on top of the buried oxide film 304 which in turn is formed or on top of the single crystalline substrate 302. Well known smoothing techniques, such as HCl smoothing or chemical mechanical polishing can be used to smooth the top surface of the low bandgap semiconductor film 306 to its desires thickness. In an embodiment of the present invention, the semiconductor film 306 is an intrinsic (i.e., undoped) narrow bandgap semiconductor film. In other embodiments, narrow bandgap semiconductor film 306 is doped to a p type or n type conductivity with a concentration level between $1 \times 10^6$–$1 \times 10^{19}$ atoms/cm$^3$. Semiconductor film 306 can be insitu doped (i.e., doped while it is deposited) or doped after it is formed on substrate 300, for example, by ion implantation 307. Doping after formation enables both PMOS and NMOS devices to be fabricated easily on the same insulating substrate 300. The doping level of the narrow bandgap semiconductor material determines the doping level of the channel region of the device.

Figure 3B:
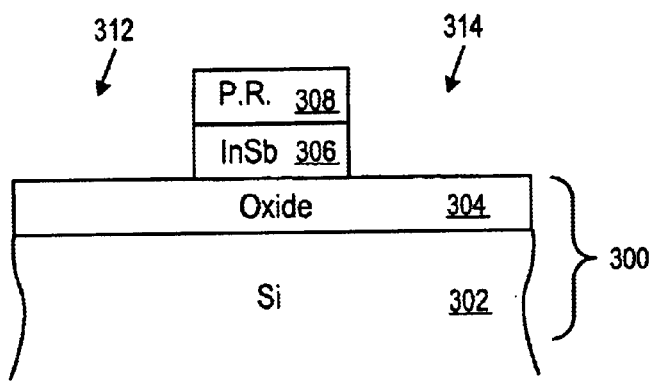

Next, as shown in FIG. 3B, a photoresist mask 308 is formed on narrow bandgap semiconductor material 306. Photoresist mask 308 can be formed by well known technique, such as by masking, exposing and developing a blanket deposited photoresist film. The photoresist mask 308 covers the portion of low bandgap semiconductor material 306 which is to become the channel region of the transistor. After forming photoresist layer 308, the narrow bandgap semiconductor film 306 is anisotropically etched in alignment with the photoresist mask utilizing well known techniques to completely remove the narrow bandgap semiconductor material 306 from locations 312 and 314 on oxide 304 where the source and drain regions are to subsequently be formed. After etching the narrow bandgap semiconductor material the portion of the narrow bandgap semiconductor material that remains provides the channel region for the transistor.

Figure 3C:
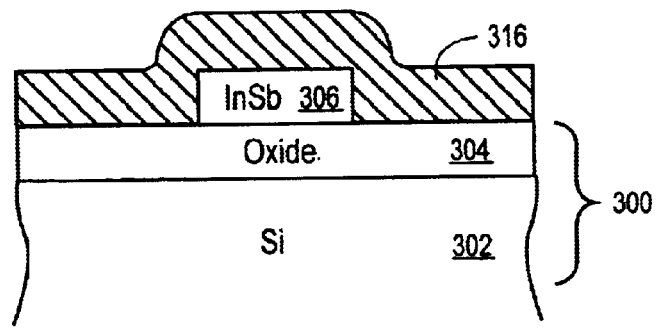

Next, as shown in FIG. 3C, the photoresist mask 308 is removed with well known techniques and a film 316 used to form the source and drain regions blanket deposited over substrate 300. In an embodiment of the present invention, film 316 is a large or wide bandgap semiconductor material, such as a III-V compound semiconductor, such as but not limited to InAlSb, InP, GaSb, GaP, and GaAs. In another embodiment of the present invention, the source/drain material 316 is formed from a metal, such as platinum, aluminum and gold which forms a Schottky barrier with narrow bandgap material 306. It is to be appreciated that the source/drain material 316 is formed in contact with the sidewall of the narrow bandgap semiconductor material 306 as shown in FIG. 3C. The source/drain film 316 is ideally blanket deposited by a low temperature, less than 500C., process such as sputtering or molecular beam epitaxy. The source/drain film 316 will typically be deposited to a thickness at least as thick as the narrow bandgap semiconductor film 306.

Figure 3D:
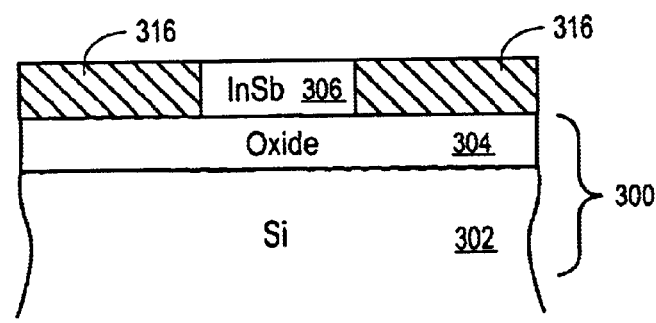

Next, as shown in FIG. 3D, source/drain film 316 is planarized so that it becomes substantially planar with the top surface of narrow bandgap semiconductor material 306. Source/drain film 316 can be planarized with well known techniques, such as but not limited to chemical mechanical polishing and plasma etch back.

Figure 3E:
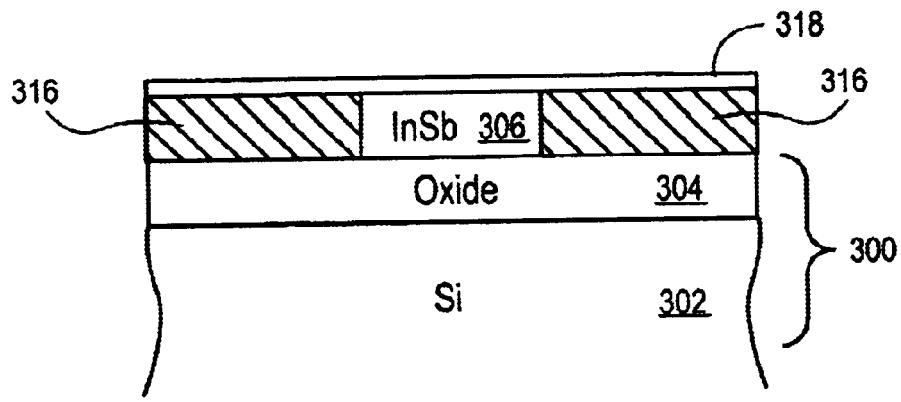

Next, as shown in FIG. 3E, a gate dielectric layer 318 is formed on narrow bandgap semiconductor film 306. Gate dielectric layer 318 is ideally a deposited dielectric film. In an embodiment of the present invention, gate dielectric layer 318 is a high dielectric constant dielectric film, such as a metal oxide dielectric as described above. A deposited dielectric will blanket deposit over all surfaces of substrate 300 including the narrow bandgap semiconductor film 306 and film 316 used to form the source and drain regions. Any well known technique, such as vapor deposition or sputtering can be used to deposit gate dielectric 318. In an embodiment of the present invention, a low temperature process, between 200–500° C., is used to deposit gate dielectric layer 318. Gate dielectric layer 318 can be formed to a thickness between 20–3000 Å and ideally between about 20–200 Å.

Figure 3F:
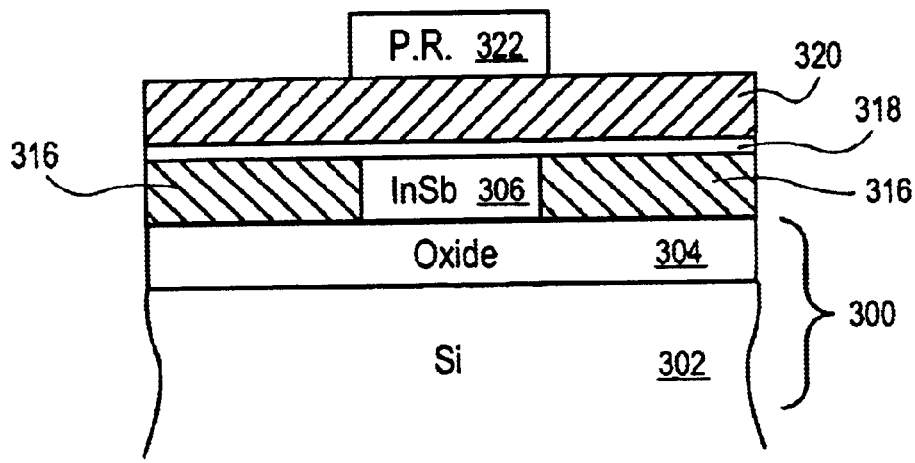

Next, as shown in FIG. 3F, a gate electrode film or films 320 are blanket deposited over gate dielectric layer 318. Gate electrode film 320 is ideally a metal film, such as tungsten, titanium and tantalum and their suicides and nitrides as set forth above. A photoresist mask 322 is then formed with well known techniques, such as masking, exposing and developing to define locations where the gate electrode of the device is to be formed. The photoresist mask 322 is formed over and completely covers the patterned narrow bandgap semiconductor material 306 used to form the channel region of the device. The photoresist mask can be made slightly wider than the narrow bandgap semiconductor channel region 306 in order to ensure complete gate coverage of the channel region and to account for misalignment.

Figure 3G:
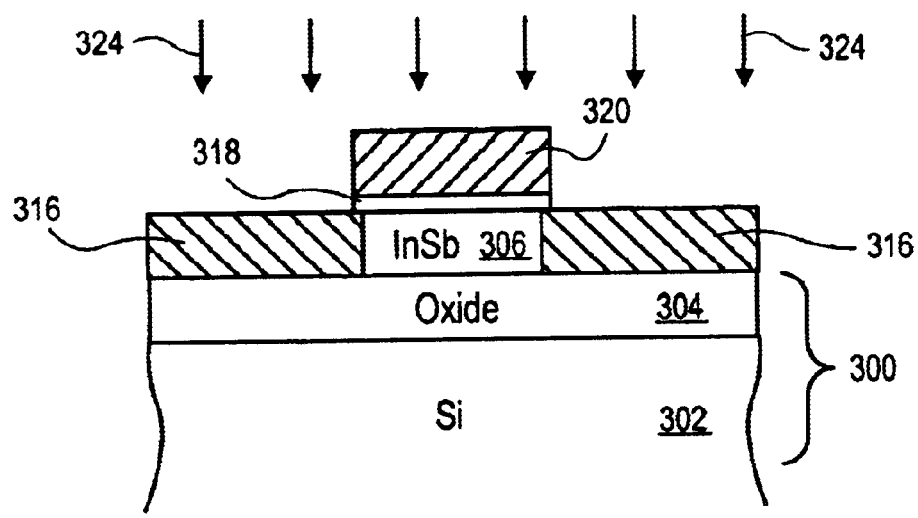

Next, as shown in FIG. 3G, the gate electrode film 320 is etched in alignment with photoresist mask 322 to define a gate electrode 320 for the device. The gate electrode completely covers the patterned narrow bandgap semiconductor film used to form the channel of the device. Additionally, at this time, the gate oxide layer formed on the source and drain regions 316 can be removed also. Next, if desired, such as when a wide bandgap semiconductor material is used as film 316 to form the source and drain regions, a source/drain implant 324 can be utilized to dope the source and drain regions 316 to the desired conductivity type and concentration. This completes the fabrication of a field effect transistor having a channel region formed from a narrow bandgap semiconductor film and specially engineered source and drain regions which prevent undesired carrier injection into the channel.

Thus, a novel transistor having a high channel mobility and saturation velocity which can be operated at low operating voltages, such as less than 0.7 Vcc, has been described.

We claim:

1. A transistor comprising:
   a channel region formed from a narrow bandgap semiconductor film formed on insulating substrate;
   a gate dielectric formed on said narrow bandgap semiconductor film;
   a gate electrode formed on said gate dielectric; and
   a pair of source/drain regions formed from a semiconductor film having a wider bandgap than said narrow bandgap semiconductor film formed on opposite sides of said gate electrode and adjacent to said low bandgap semiconductor film and wherein said gate electrode overlaps a portion of said source/drain.

2. The transistor of claim 1 wherein said narrow bandgap semiconductor film has a bandgap of less than or equal to 0.7 eV.

3. The transistor of claim 2 wherein said narrow bandgap semiconductor film is selected from the group consisting of InAs, PdTe and InSb.

4. The transistor of claim 1 wherein said narrow bandgap semiconductor film comprises InSb.

5. The transistor of claim 1 wherein said gate dielectric comprises a high dielectric constant film.

6. The transistor of claim 1 wherein said source and drain regions are formed from a III-V semiconductor.

7. The transistor of claim 1 wherein said gate electrode is a metal gate electrode.

8. The transistor of claim 1 wherein the bandgap of said semiconductor film of said source/drain regions is at least 0.2 eV greater than the bandgap of said channel region.

9. The transistor of claim 1 wherein said semiconductor film of said source/drain regions is selected from the group consisting of InAlSb, InP, GaSb, GaP, and GaAs.

10. A transistor comprising:
    a channel region formed from narrow bandgap semiconductor film formed on an insulating substrate;
    a gate dielectric formed on said narrow bandgap semiconductor film;
    a gate electrode formed on said gate dielectric; and
    a pair of metal source/drain regions formed along opposite sides of said gate electrode and adjacent to said narrow bandgap semiconductor film and wherein said gate electrode overlaps a portion of said source/drain.

11. The transistor of claim 10 wherein said narrow bandgap semiconductor film has a bandgap of less than or equal to 0.7 eV.

12. The transistor of claim 10 wherein said narrow bandgap semiconductor film is selected from the group consisting of InAs, PdTe and InSb.

13. The transistor of claim 10 wherein said source/drain regions are formed from a material selected from the group consisting of titanium nitride, tantalum nitride and hefium nitride.

14. The transistor of claim 10 wherein said source/drain regions are formed from a metal film which can form a Schottky barrier with said low bandgap semiconductor film.

15. The transistor of claim 10 wherein said metal film is selected from the group consisting of platinum, aluminum and gold.

16. The transistor of claim 10 wherein said gate dielectric has a dielectric constant greater than 9.0.

17. The transistor of claim 10 wherein said gate dielectric comprises a metal oxide dielectric.

18. The transistor of claim 10 wherein said gate dielectric layer is selected from the group consisting of PZT, BST, tantalum pentaoxide, hefium oxide, zirconium oxide and aluminum oxide.

19. The transistor of claim 10 wherein said gate dielectric layer has a thickness between 20–3000 Å.

20. The transistor of claim 10 wherein said gate electrode comprises a metal film.

21. The transistor of claim 10 wherein said gate electrode has a midgap work function.

22. The transistor of claim 10 wherein said transistor has a gate length of less than or equal to 30 nanometers.

23. The transistor of claim 10 wherein said thickness of said narrow bandgap semiconductor film is approximately ⅓ the gate length of said transistor.

24. The transistor of claim 10 wherein said insulating substrate comprises a silicon dioxide film formed on a monocyrstalline silicon substrate.

25. A transistor comprising:
    a channel region formed from a narrow bandgap semiconductor film formed on insulating substrate;
    a gate dielectric having a dielectric constant greater than 9.0 formed on said narrow bandgap semiconductor film;
    a gate electrode formed on said gate dielectric; and
    a pair of source/drain regions formed on said insulating substrate and adjacent to opposite sides of said narrow bandgap semiconductor film wherein said gate dielectric overlaps a portion of said source/drain regions.

26. The transistor of claim 25 wherein said source/drain regions are formed from a metal film.

27. The transistor of claim 25 wherein said source/drain regions are formed from a wide bandgap semiconductor film.

* * * * *

UNITED STATES PATENT AND TRADEMARK OFFICE
CERTIFICATE OF CORRECTION

PATENT NO. : 6,825,506 B2
DATED : November 30, 2004
INVENTOR(S) : Chau et al.

It is certified that error appears in the above-identified patent and that said Letters Patent is hereby corrected as shown below:

Column 6,
Line 60, delete "suicides" and insert -- silicides --.

Signed and Sealed this

Sixteenth Day of August, 2005

JON W. DUDAS
*Director of the United States Patent and Trademark Office*

UNITED STATES PATENT AND TRADEMARK OFFICE
CERTIFICATE OF CORRECTION

PATENT NO.    : 6,825,506 B2
DATED         : November 30, 2004
INVENTOR(S)   : Chau et al.

It is certified that error appears in the above-identified patent and that said Letters Patent is hereby corrected as shown below:

Column 3,
Line 45, delete "suicides" and insert -- silicides --.

Signed and Sealed this

Eighth Day of November, 2005

JON W. DUDAS
*Director of the United States Patent and Trademark Office*